(12) United States Patent
Tae et al.

(10) Patent No.: US 12,123,090 B2
(45) Date of Patent: Oct. 22, 2024

(54) DIFFERENTIAL CAPACITIVE SENSOR FOR IN-SITU FILM THICKNESS AND DIELECTRIC CONSTANT MEASUREMENT

(71) Applicant: Applied Materials, Inc., Santa Clara, CA (US)

(72) Inventors: Patrick Tae, Sunnyvale, CA (US); Yaoling Pan, San Diego, CA (US); Leonard M Tedeschi, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 18/368,285

(22) Filed: Sep. 14, 2023

(65) Prior Publication Data
US 2024/0002999 A1 Jan. 4, 2024

Related U.S. Application Data

(62) Division of application No. 16/526,268, filed on Jul. 30, 2019, now Pat. No. 11,781,214.

(51) Int. Cl.
| | |
|---|---|
| *C23C 14/52* | (2006.01) |
| *C23C 14/54* | (2006.01) |
| *C23C 16/52* | (2006.01) |
| *G01N 27/22* | (2006.01) |
| *H01J 37/32* | (2006.01) |

(52) U.S. Cl.
CPC .......... *C23C 14/52* (2013.01); *C23C 14/545* (2013.01); *C23C 16/52* (2013.01); *G01N 27/22* (2013.01); *H01J 37/32935* (2013.01)

(58) Field of Classification Search
CPC ....... C23C 14/52; C23C 14/545; C23C 16/52; G01N 27/22; H01J 37/32935
See application file for complete search history.

(56) References Cited

U.S. PATENT DOCUMENTS

| | | | |
|---|---|---|---|
| 5,296,255 A | 3/1994 | Gland et al. | |
| 9,182,861 B2 | 11/2015 | Bulea et al. | |
| 11,781,214 B2 * | 10/2023 | Tae ........................ | C23C 16/52 |
| | | | 427/9 |

(Continued)

FOREIGN PATENT DOCUMENTS

| | | |
|---|---|---|
| CN | 107270822 A | 7/2019 |
| CN | 108332674 A | 1/2020 |

(Continued)

*Primary Examiner* — Jeffrie R Lund
(74) *Attorney, Agent, or Firm* — MOSER TABOA

(57) ABSTRACT

Methods and apparatus for a processing chamber are provided herein. The apparatus includes, for example, an inner volume defined in the processing chamber; a first sensor assembly coupled to a surface located in the inner volume of the processing chamber and including a first electrode configuration configured to measure an electrical characteristic associated with a film deposited within the inner volume of the processing chamber; and a second sensor assembly coupled to the surface located in the inner volume of the processing chamber in relative proximity to the first sensor assembly and including a second electrode configuration, different from the first electrode configuration, configured to measure the same electrical characteristic as the first electrode configuration.

7 Claims, 5 Drawing Sheets

(56) References Cited

U.S. PATENT DOCUMENTS

| | | |
|---|---|---|
| 2009/0058424 A1 | 3/2009 | Tatsumi et al. |
| 2011/0108932 A1 | 5/2011 | Benzel et al. |
| 2017/0365531 A1 | 12/2017 | Tedeschi et al. |
| 2018/0267086 A1 | 9/2018 | Rinzan |
| 2021/0005435 A1 | 1/2021 | Jung et al. |
| 2021/0020410 A1 | 1/2021 | Nichols et al. |
| 2021/0033557 A1 | 2/2021 | Tae et al. |
| 2024/0002999 A1* | 1/2024 | Tae .................. C23C 14/52 |

FOREIGN PATENT DOCUMENTS

| | | |
|---|---|---|
| JP | WO2002063064 A1 | 6/2004 |
| JP | 2004259885 A | 9/2004 |
| JP | 6776375 B2 | 10/2020 |
| KR | 1998-0069954 A | 10/1998 |
| KR | 20110121112 A | 11/2011 |
| TW | 1722386 B | 3/2021 |
| TW | 202201460 A | 1/2022 |
| WO | WO 2006011954 A2 | 2/2006 |
| WO | WO 2017/157362 A1 | 9/2017 |

\* cited by examiner ic CAPACITIVE SENSOR FOR
DIFFERENTIAL CAPACITIVE SENSOR FOR IN-SITU FILM THICKNESS AND DIELECTRIC CONSTANT MEASUREMENT

CROSS-REFERENCE TO RELATED APPLICATIONS

The present application is a divisional application of U.S. patent application Ser. No. 16/526,268, filed on Jul. 30, 2019, the entire contents of which is incorporated herein by reference.

FIELD

Embodiments of the present disclosure generally relate to measurement apparatus and methods, and more particularly, to apparatus and methods that use differential capacitive sensors for in-situ film thickness (t) and/or dielectric constant (k) measurement.

BACKGROUND

Deposition processes, such as, physical vapor deposition (PVD), chemical vapor deposition (CVD), atomic layer deposition (ALD), used to deposit a film on one or more types of substrates are known. During such processes, film thickness and/or dielectric constant on a substrate and/or on chamber surfaces may need to be measured. Wall sensors configured for capacitive sensing can be used to measure such parameters, but such sensors, typically, require calibration, e.g., with coupon tests, which can be relatively expensive, time consuming, and must be repeated for every new process.

The inventors have found that differential capacitive sensors can be used for in-situ film thickness and/or dielectric constant measurement.

SUMMARY

Methods and apparatus for in-situ film thickness and/or dielectric constant measurement are provided herein. In some embodiments, for example, a processing chamber can include an inner volume defined in the processing chamber; a first sensor assembly coupled to a surface located in the inner volume of the processing chamber and including a first electrode configuration configured to measure an electrical characteristic associated with a film deposited within the inner volume of the processing chamber; and a second sensor assembly coupled to the surface located in the inner volume of the processing chamber in relative proximity to the first sensor assembly and including a second electrode configuration, different from the first electrode configuration, configured to measure the same electrical characteristic as the first electrode configuration.

In some embodiments, a processing chamber can include an inner volume defined in the processing chamber; and a sensor assembly coupled to a surface located in the inner volume of the processing chamber and comprising an electrode configuration comprising a plurality of electrodes configured for time multiplexing, such that the plurality of electrodes provides a first input corresponding to a first time and a first response function, and a second input corresponding to a second time and a second response function different from the first response function.

In some embodiments, a method of processing a substrate in a processing chamber can include processing the substrate positioned in an inner volume defined in the processing chamber; receiving at a controller of the processing chamber a first input corresponding to a first response function from a first electrode configuration of a first sensor assembly coupled to a surface located in the inner volume of the processing chamber; receiving at the controller a second input corresponding to a second response function from a second electrode configuration, which is different from the first electrode configuration, of a second sensor assembly coupled to the surface located in the inner volume of the processing chamber in relative proximity to the first sensor assembly; and determining, based on the first response function and the second response function, at least one of a thickness or a dielectric constant of a film deposited within the inner volume of the processing chamber as a result of the process.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of apparatus and methods that use differential capacitive sensors for in-situ film thickness (t) and/or dielectric constant (k) measurement are provided herein. More particularly, the inventors have found that multiple capacitive sensors with different nonlinear response functions enable independent analysis of film thickness (t) and dielectric constant (k). Accordingly, the apparatus and methods described herein provide cost savings and faster processing times when compared to conventional apparatus and methods that use, for example, capacitive wall sensors for determining film thickness (t) and/or dielectric constant (k).

The apparatus and methods described herein can be used in various applications including, but not limited to, determining deposition on surfaces within processing chambers (e.g., track deposition on liner, lid, ring, below plasma screen, etc.), determining in situ surface measurement of substrate being processed in processing chambers (e.g., track etch rate and/or surface properties on a substrate (or wafer) that is being processed or test structures (coupons), etc.), determining in situ measurement of ion content in substrate being processed, determining in situ measurement of erosion rate of substrate surfaces and/or surfaces in challenging environments (e.g., caustic, aerospace, etc.), or determining in situ molecular detection in biological systems.

Figure 1:
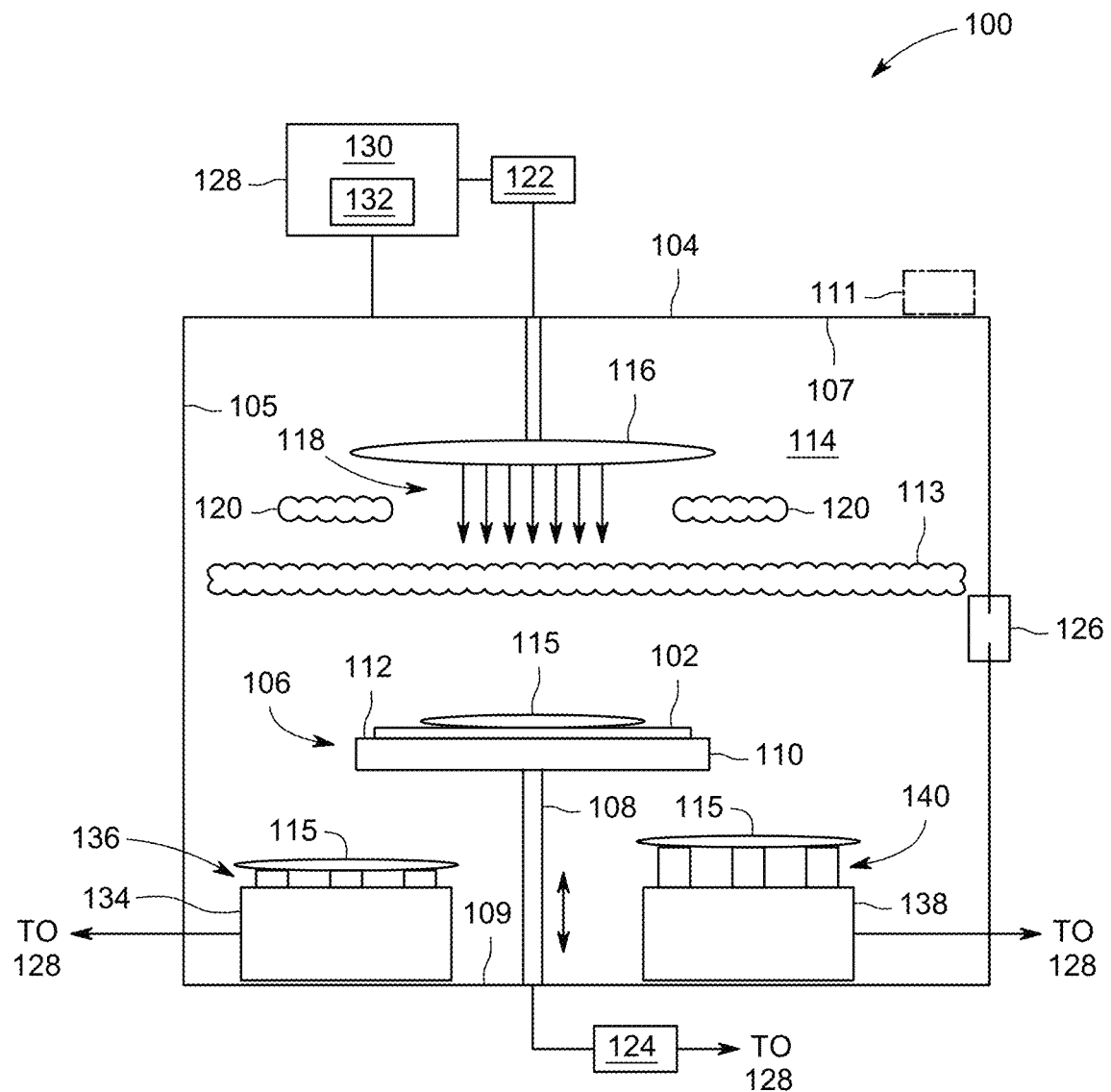
FIG. 1 is a schematic diagram of a system for processing a substrate, in accordance with embodiments of the present disclosure.

FIG. 1 is a schematic diagram of a system 100 for processing a substrate 102 (or wafer), in accordance with an embodiment of the present disclosure. The system 100 includes apparatus that can be embodied in a processing chamber 104. The processing chamber 104 can be any type of processing chamber including, but not limited to, a PVD processing chamber, a CVD processing chamber, an ALD processing chamber, an etch chamber or other type of processing chamber. An example of a PVD processing chamber that can be configured for use with the system 100 can be the ENDURA® VERSA® line of stand-alone PVD apparatus, available from Applied Materials, Inc. An example of a CVD processing chamber that can be configured for use with the system 100 can be the PRODUCER® APF line of stand-alone CVD apparatus, available from Applied Materials, Inc. Similarly, an example of an ALD processing chamber that can be configured for use with the system 100 can be the OLYMPIA® line of ALD apparatus, available from Applied Materials, Inc. Moreover, one or more of the etch line of apparatus, e.g., CENTRIS®, CENTURA®, PRODUCER®, also available from Applied Materials, Inc. can be configured for use with the system 100. One or more of the aforementioned apparatus can be combined on a cluster tool, e.g., CENTURA®. For example, the cluster tool can be configured to perform ALD, CVD, epitaxy, etch, photomask fabrication, PVD, plasma doping, plasma nitridation and RTP, as well as integrated multi-step processes such as high-k transistor gate stack fabrication.

For illustrative purposes, the processing chamber 104 is described herein as a PVD processing chamber 104 for PVD of materials on a substrate 102 disposed in the processing chamber 104.

Continuing with reference to FIG. 1, the processing chamber 104 includes a pedestal 106. The pedestal 106 includes a pedestal support 108, which can be moveable along a vertical axis, that connects to a substrate support 110 that includes a substrate support surface 112. The substrate support surface 112 is configured to support the substrate 102 once the substrate 102 is loaded into an inner volume 114 of the processing chamber 104. The pedestal support 108 including the substrate support 110 having the substrate 102 disposed thereon may be configured to move closer to or further from a target of source material (e.g., in a direction normal to the plane of the substrate support surface 112). More particularly, the pedestal support 108 can move up and down (e.g., as shown by directional arrows in FIG. 1) sufficiently to allow a stream of material flux to impinge upon desired portions of the substrate 102, such as the entire substrate 102. A position control mechanism 124, such as an actuator, motor, drive, or the like, controls the position of the pedestal support 108. Optionally, the pedestal support 108 may additionally be configured to rotate (e.g., within the plane of the substrate support surface 112).

In addition, the pedestal support 108 can move to a position for loading and unloading of substrates into and out of the processing chamber 104. For example, a selectively sealable opening 126, such as a slit valve, is provided to load and unload substrates from the processing chamber 104. In some embodiments, a transfer chamber (not shown), such as a load lock, may be coupled to the processing chamber 104 via the selectively sealable opening 126. A substrate transfer robot (not explicitly shown), or other similar suitable substrate transfer device, can be disposed within the transfer chamber to move substrates into and out of the processing chamber 104 (and onto and off the substrate support 110). Lift pins or other suitable mechanisms may be provided to lift the substrate 102 from the substrate support 110 when in the loading and unloading position.

The processing chamber 104 is configured to provide a directed stream of material flux (stream 118 as depicted in FIG. 1) from a target 116 of source material toward the substrate support 110 (and any substrate 102 disposed on the substrate support 110). The target 116 of source material is to be sputter deposited on the substrate 102. In general, the target 116 of source material can be any material typically used in thin film fabrication via PVD. For example, in some embodiments, the target 116 of source material can be, for example, a metal, such as titanium (Ti), or the like, suitable for depositing Ti or Ti nitride (TiN) on the substrate 102. In some embodiments, the target 116 of source material can be, for example, silicon (Si), or a silicon-containing compound, suitable for depositing Si, silicon nitride (SiN), silicon oxynitride (SiON), or the like on the substrate 102. Other materials may suitably be used as well in accordance with the teachings provided herein.

The target 116 of source material is generally elongate and can be, for example, cylindrical or rectangular. A size of the target 116 of source material can vary depending upon a size of the substrate 102 and/or a configuration of the processing chamber 104. For example, for processing a 300 mm diameter semiconductor wafer, the target 116 of source material can be between about 100 to about 200 mm in width or diameter, and can have a length of about 400 to about 600 mm. The target 116 of source material can be stationary or movable, including rotatable along an elongate axis of the target 116 of source material.

The processing chamber 104 further includes, or is coupled to, a power source 122 to provide suitable power for forming a plasma 120 proximate the target 116 of source material and for sputtering atoms off the target 116 of source material. The power source 122 can be either or both of a DC or an RF power source. A gas supply (not shown) may be coupled to the inner volume 114 of the processing chamber 104 to provide a process gas, such as an inert gas (e.g., argon) or nitrogen (N2) suitable for forming a plasma within the inner volume 114 when sputtering material from the target 116 of source material (creating the stream 118 of material flux). A vacuum pump can be coupled to an exhaust port (not shown) in the housing of the processing chamber 104 to control a pressure during processing.

In some embodiments, a plurality of magnets (not shown) may be positioned proximate the target 116 of source material to control a position of the plasma 120 with respect to the target 116 of source material during processing. The deposition process can be tuned by controlling the plasma position (e.g., via the magnet position), and the size and relative position of the selectively sealable opening 126.

A controller 128 including a processor 130 is configured (or programmed) to control the overall operation of the processing chamber 104. For example, the controller 128, under control of the processor 130, can receive a recipe that is input into a memory 132 of the processor 130. The recipe can include information relating to one or more parameters associated with one or more of the aforementioned components used for processing the substrate 102. For example, the controller 128 can use the information in the recipe to control the power source 122 for controlling an amount of power used during operation, the position control mechanism 124 for controlling a height of the pedestal support 108, such as when the substrate 102 is being loaded into the processing chamber 104 or being processed, the gas supply for controlling an amount of gas that is to be supplied into the processing chamber 104, the plurality of magnets for controlling a position of the magnets or a speed at which the magnets are rotated, etc.

During operation, the controller 128 is also configured to receive a first input corresponding to a first response function from a first sensor assembly 134, which includes a first electrode configuration 136, and a second input corresponding to a second response function from a second sensor assembly 138, which includes a second electrode configuration 140. The controller 128 uses the first and second inputs and information stored in the memory 132 of the processor 130 to determine a film thickness (t) and/or a dielectric constant (k) of a film 115 deposited within the inner volume 114 based on the first response function and the second response function, as will be described in greater detail below. For illustrative purposes, the film is shown deposited on the first sensor assembly 134, the second sensor assembly 138, and the substrate 102) of the processing chamber 104.

The first sensor assembly 134 and the second sensor assembly 138 can be in operable communication with the controller 128 via a wired or wireless interface. For example, in some embodiments, interface electronics can be provided on the first sensor assembly 134 and the second sensor assembly 138 and can be configured to wirelessly transmit capacitive sensing information to the controller 128 and/or an outside or remote device used for data processing. Alternatively or additionally, the capacitive sensing information can be stored on a memory (not shown) on the substrate 102 for future data processing. The interface electronics can include, but is not limited to, capacitance sampling and conversation, analog output to an analog/digital (A/D) converter, etc. The digital signals can be subsequently wirelessly transmitted via, for example, an on substrate wireless communication module (e.g., wireless-fidelity (Wi-Fi), Bluetooth, NFC, etc.) or stored on the memory of the substrate 102. Additionally, each of the first sensor assembly 134 and the second sensor assembly 138 can be powered using the power source 122 and/or a power source provided on the first sensor assembly 134 and the second sensor assembly 138.

The first sensor assembly 134 and the second sensor assembly 138 can be coupled to any surface located in the inner volume 114 of the processing chamber 104. For example, in some embodiments, the first sensor assembly 134 and the second sensor assembly 138 can be disposed on the pedestal 106 (or component of the pedestal 106, such as the substrate support 110), a wall or surface of the processing chamber 104 (e.g., a sidewall 105, a top surface or lid 107, a bottom surface 109, such as in the illustrated embodiment), a nozzle 111, which can be located on the lid 107 and used for injecting process gas in the inner volume 114 of the processing chamber 104, or adjacent a plasma screen 113.

In some embodiments, the first sensor assembly 134 and the second sensor assembly 138 can be disposed on a substrate, or a test wafer and/or on a metrology wafer (e.g., for wafer metrology).

For example, with respect to wafer metrology, a metrology wafer or test wafer can have the differential capacitive sensors (e.g., first sensor assembly 134 and the second sensor assembly 138) fabricated and/or populated thereon. The metrology wafer or test wafer can be used to monitor, for example, thin film processes, such as PVD, CVD, ALD, and/or by-product depositions, such as in an etch process, The thin films or by-product materials deposited on the metrology wafers or test wafers can be measured for thickness and dielectric constant in-situ using the differential capacitive sensors. Compared to existing methods that are required to measure or characterize the thin films externally, e.g., outside of a processing chamber, the differential capacitive sensors can provide insightful information in-situ. For example, during one or more of the above described thin film deposition processes, surface nucleation, which plays a significant role in determining final film properties, can be monitored, e.g., the differential capacitive sensors described herein can be used to monitor and/or to extract surface modification information of the metrology wafer in-situ.

Furthermore, the differential capacitive sensor structures can also be implemented or integrated with devices on product wafers to provide in-situ thin film process information, which then can be correlated to final device performance.

Regardless of the positioning of the first sensor assembly 134 and the second sensor assembly 138 within the processing chamber 104, the first sensor assembly 134 and the second sensor assembly 138 should be disposed in relatively close proximity to one another to provide accurate calculations (e.g., good confidence/resolution of a common value or an intersection point, as will be described in greater detail below).

Each of the first electrode configuration 136 and the second electrode configuration 140 are configured to measure one or more electrical characteristics associated with the film 115 deposited (e.g., from the target 116 of source material) within the inner volume 114 of the processing chamber 104. For example, the first electrode configuration 136 and the second electrode configuration 140 can be configured to measure a capacitance, resistance, impedance, inductance, etc. More particularly, the first electrode configuration 136 and the second electrode configuration 140 are configured to measure the same electrical characteristic. That is, if the first electrode configuration 136 is configured to measure capacitance, then the second electrode configuration 140 will also be configured to measure capacitance. The measured electrical characteristic is transmitted from the first sensor assembly 134 and the second sensor assembly 138 to the controller 128. For example, when the first electrode configuration 136 and the second electrode configuration 140 are configured to measure a capacitance, the first input and the second input are measurements of capacitance that are transmitted to the controller 128.

The controller 128 receives the first and second inputs and, as noted above, uses the first and second inputs and information stored in the memory 132 of the processor 130 to determine a thickness (t) and/or a dielectric constant (k) of the film 115 deposited within the inner volume 114 of the processing chamber 104 based on the first response function and the second response function. Particularly, for each of the capacitance measurements associated with the first and second inputs, the processor 130 uses the corresponding first and second response functions to determine a range of possible thicknesses (t) and/or a dielectric constants (k) of the film 115 deposited within the inner volume 114. More particularly, the capacitance measurement includes a plurality of capacitance measurements that are obtained from each electrode of a plurality of electrodes of the first electrode configuration 136 and the second electrode configuration 140. The processor 130 generates the first response function and the second response function, which can include the plurality of capacitance measurements as a function of known ranges of dielectric constant values and thickness values of the material used for PVD. The known ranges of dielectric constant values and thickness values of the material can be obtained via empirical data or other methods. At any time while the substrate 102 is being processed, the processor 130 can determine a dielectric constant (k) and a thickness (t) of the material based on a common value (or intersection point of the first response function and the second response function) of the dielectric constant values and thickness values of the material. The inventors have found that an accuracy in the measurement or range of potential thickness and dielectric constant values that can be obtained by the processor 130 is a function of a measurement of noise and electrode design, which can be calculated analytically. As noted above, a source of the material deposited on the substrate 102 may be from PVD, CVD, ALD, etch byproduct, or other sources of material deposition. Alternatively or additionally, the processor 130 can be configured to measure a material conversion involving a change of dielectric constant, even if no material is deposited on the substrate 102 and/or a thickness doesn't change.

The inventors have found that to obtain an accurate common value from the capacitance measurements, the first electrode configuration 136 and the second electrode configuration 140—in addition to being in relatively close proximity to one another—are required to provide different response functions. Accordingly, in some embodiments, while the first sensor assembly 134 and the second sensor assembly 138 can be identical to one another, the first electrode configuration 136 and the second electrode configuration 140, however, are different from one another, e.g., the first electrode configuration 136 and the second electrode configuration 140 have different geometries, as opposed to merely scaled down dimensions, as will be described in greater detail below.

Figure 2:
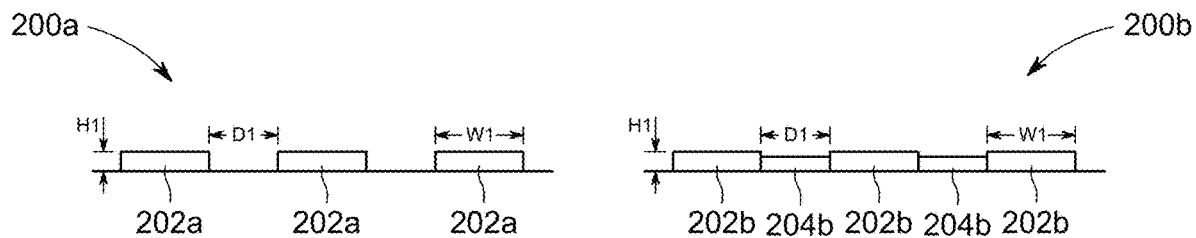
FIG. 2 is a diagram of a sensor assembly having an electrode configuration in accordance with at least some embodiments of the present disclosure.
Figure 3:
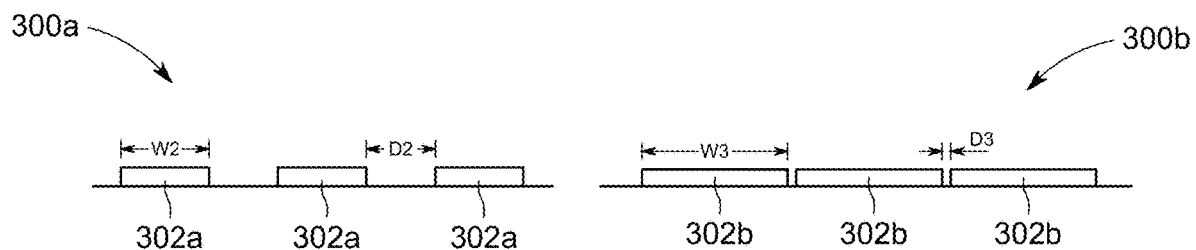
FIG. 3 is a diagram of a sensor assembly having an electrode configuration in accordance with at least some embodiments of the present disclosure.

FIGS. 2-10 are diagrams of various sensor assemblies including corresponding electrode configurations, in accordance with some embodiments of the present disclosure. FIGS. 2 and 3, for example, illustrate a respective first sensor assembly 200a, 300a (sensor assembly 200a and sensor assembly 300a) and second sensor assembly 200b, 300b (sensor assembly 200a and sensor assembly 300a).

The sensor assembly 200a includes a first electrode configuration including a plurality of electrodes 202a (electrodes 202a) and the sensor assembly 200b includes a second electrode configuration including a plurality of electrodes 202b (electrodes 202b). For illustrative purposes, only three of the electrodes 202a, 202b are shown, more or fewer electrodes can be used. As can be appreciated, the more electrodes that are used, the more accurate a capacitance measurement will be, and thus, the more accurate a determination of the dielectric constant (k) and the film thickness (t) of the material will be.

The electrodes 202a and 202b are identical to one another and can include any geometric configuration including, but not limited to, rectangular, circular, oval, elliptical, triangular, pyramidal, etc. For example, in FIG. 2 each of the electrodes 202a, 202b includes a generally rectangular configuration defined by relatively flat surfaces. Each electrode of the electrodes 202a, 202b includes a height $H_1$, a width and is separated or spaced-apart from the other electrodes by a distance $D_1$. For illustrative purposes, the depth of the electrodes is not shown, but is assumed equal to the $W_1$, e.g., the sides of the electrodes form a square, and thus are equidistantly arranged. The heights and widths of the electrodes 202a, 202b and the distance that separates each of the electrodes 202a, 202b are identical to each other. In some embodiments, however, the heights and widths of electrodes and the distance that separates each of the electrodes on different sensor assemblies can be different, as will be described in greater detail below.

So that a response function of the electrodes 202a is different from a response function of the electrodes 202b, dielectric material 204b (or filler) can be disposed between the electrodes 202b. The dielectric material 204b can be made from any suitable dielectric material including, but not limited to, oxide ($O_2$), nitrogen (N), sulfur hexaflouride ($SF_6$), glass, porcelain, etc. For example, in FIG. 2, the dielectric material 204b is made from $O_2$, or other oxygen containing materials. The amount (or a type) of dielectric material 204b disposed between the electrodes 202b can be varied to achieve a desired response function. For example, an amount, e.g., level, height, width, depth, etc., of dielectric material 204b in a first row of electrodes of the electrodes 202b can be greater or less than an amount of (or can be a different of dielectric material from) the dielectric material 204b in a second, third, fourth, . . . $n^{th}$ row of electrodes of the electrodes 202b.

FIG. 3 illustrates the sensor assembly 300a and the sensor assembly 300b including respective electrodes 302a, 302b. The electrodes 302a can be identical to the electrodes 202a. To make a response function of the electrodes 302b relative to the electrodes 302a different, however, a width of and distance between each electrode of the electrodes 302b can be different (e.g., greater than or less than) from a width of and distance between each electrode of the electrodes 302a. For example, a width $W_2$ of each electrode of the electrodes 302a can be about 1 μm to about 3 μm and a distance (or spacing) $D_2$ between adjacent or neighboring electrodes of the electrodes 302a can be about 1 μm to about 3 μm. Conversely, to achieve a desired response function, a width $W_3$ of each electrode of the electrodes 302b can be about 5 μm to about 7 μm and a distance $D_3$ between adjacent or neighboring electrodes of the electrodes 302b can be about 100 nm to about 500 μm. Alternatively, the width of and distance between each electrode of the electrodes 302b can be made smaller and larger, respectively, relative to the electrodes 302a of the sensor assembly 300a. In some embodiments, a height of the electrodes 302a can be different from (e.g., greater than or less than) a height of the electrodes 302b, as will be described in greater detail below.

Figure 4:
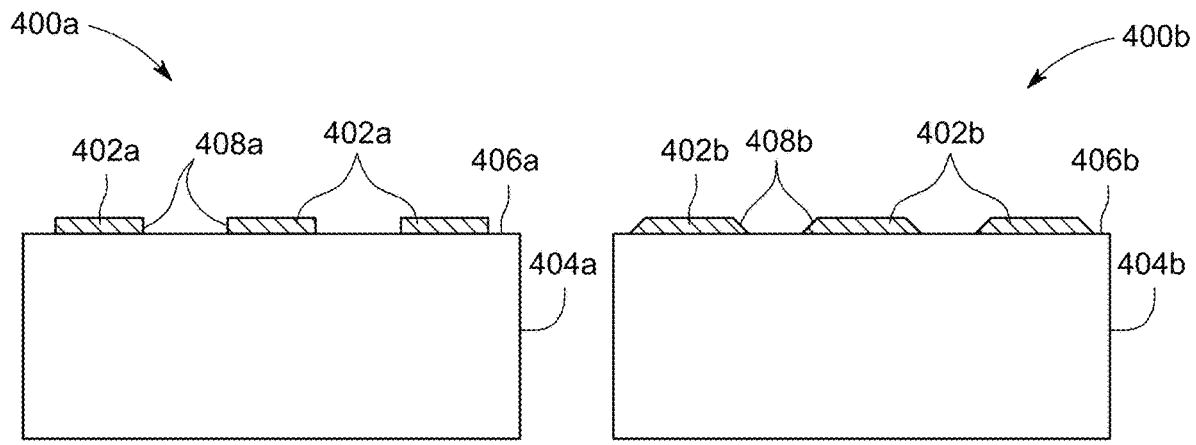
FIG. 4 is a diagram of a sensor assembly having an electrode configuration in accordance with at least some embodiments of the present disclosure.

FIG. 4 illustrates a sensor assembly 400a including electrodes 402a and a sensor assembly 400b including electrodes 402b. The sensor assembly 400a and sensor assembly 400b include a first substrate 404a and a second substrate 404b, respectively, on which the electrodes 402a and 402b can be disposed. The first substrate 404a and the second substrate 404b are configured to support the electrodes 402a and the electrodes 402b and are not configured for processing within a process chamber. In some embodiments, however, as noted above, the electrodes 402a and the electrodes 402b can be provided on a substrate (e.g., the substrate 102) that is to be processed with a processing chamber.

The first substrate 404a and the second substrate 404b can be made from any suitable insulator material including, but not limited to, glass, ceramic, polymer based materials, etc. To make a response function of the electrodes 402b relative to the electrodes 402a different, the electrodes 402a and 402b can have sides (or sidewalls) that are different from each other (e.g., the sides of the electrodes 402a can be straight and the sides of the electrodes 402b can be slanted or tapered). For example, the electrodes 402a can have sides 408a that extend perpendicularly (e.g., at a right angle (90°)) from a top surface 406a of the first substrate 404a. Conversely, the electrodes 402b can have sides that extend at an angle from about to about 55°. In some embodiments, the electrodes 402b can have sides that extend at an angle less than 45° and greater than 55° from a top surface 406b of the second substrate 404b. In some embodiments, the sides 408a of the electrodes 402a can also be slanted or tapered. For example, the sides 408a can extend from the top surface 406a at an angle that is greater or less than that the sides 408b extend from the top surface 406b. For example, the sides 408a can extend from the top surface 406a at an angle that is about 10° to about 15° and the sides 408b can extend from the top surface 406b at an angle that is about 55° to about 60°. In some embodiments, the sides 408a can extend from the top surface 406a at an angle that is less than 10° and greater than 15° and the sides 408b can extend from the top surface 406b at an angle that is less than 55° and greater than 60°.

Figure 5:
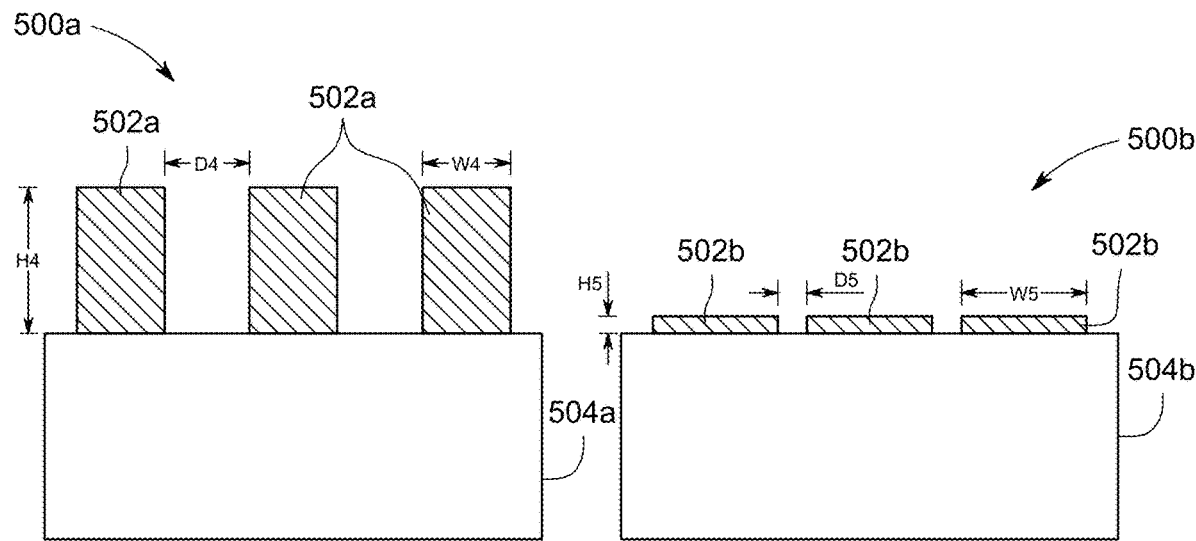
FIG. 5 is a diagram of a sensor assembly having an electrode configuration in accordance with at least some embodiments of the present disclosure.

FIG. 5 illustrates a sensor assembly 500a including electrodes 502a and a sensor assembly 500b including electrodes 502b. The sensor assembly 500a and the sensor assembly 500b include a respective substrate 504a and substrate 504b. In the embodiment illustrated in FIG. 5, one of the sensor assemblies can have a high aspect ratio and the other sensor assembly can have a low aspect ratio to achieve different response functions. For example, as noted above, in addition to making the widths of the electrodes different, the heights of the electrodes can also be different. For example, each electrode of the electrodes 502a can have a width $W_4$, can have a distance $D_4$ between adjacent or neighboring electrodes of the electrodes 502a, and can have a height $H_4$. Conversely, each electrode of the electrodes 502b can have a width $W_5$, can have a distance $D_5$ between adjacent or neighboring electrodes of the electrodes 502b, and can have a height $H_5$. One or more of the dimensions $W_5$, $D_5$, and $H_5$ are different from the dimensions $W_4$, $D_4$, and $H_4$ of the electrodes 502a of the sensor assembly 500a. For example, the width $W_4$ of the electrodes 502a can be less than the width $W_5$ of the electrodes 502b, and accordingly the distance $D_4$ of the electrodes 502a can be greater than the distance $D_5$ of the electrodes 502b. Similarly, the height $H_4$ of the electrodes 502a can be greater than the height $H_5$ of the electrodes 502b. In some embodiments, the distance $D_4$ and distance $D_5$ can be the same as the $D_2$ and distance $D_3$ of FIG. 3, respectively, and the width $W_4$ and width $W_5$ can be the same as the $W_2$ and distance $W_3$ of FIG. 3, respectively. Moreover, in some embodiments, the height $H_4$ can be about 2 μm-500 μm and the height $H_5$ can be about 50 nm-2 μm. Alternatively, one or more of the dimensions $D_4$, $D_5$, $W_4$, $W_5$, $H_4$, and/or $H_5$ can be greater than or less than those described herein.

Figure 6:
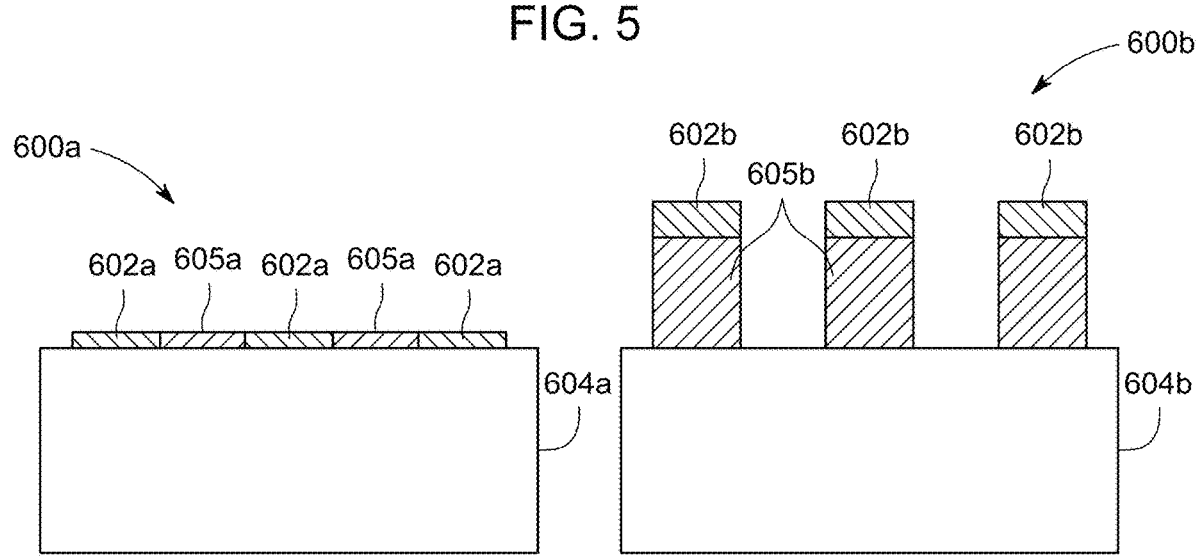
FIG. 6 is a diagram of a sensor assembly having an electrode configuration in accordance with at least some embodiments of the present disclosure.

FIG. 6 illustrates a sensor assembly 600a including electrodes 602a and a sensor assembly 600b including electrodes 602b. The sensor assembly 600a and the sensor assembly 600b include a respective substrate 604a and substrate 604b. As noted above, to achieve different response functions, one of sensor assemblies can have dielectric material (or filler) disposed between the electrodes, while the other does not. Additionally, the location of the dielectric material can be different on each of the sensor assemblies. For example, disposed between each of the electrodes 602a can be dielectric material 605a, identical to the dielectric material 204b. Conversely, to achieve the different response functions, instead of providing the dielectric material between each of the electrodes 602b, dielectric material 605b can be provided under each of the electrodes 602b (e.g., for creating a corresponding dielectric pedestal. The amount of the dielectric material 605b that is disposed under each of the electrodes 602b can depend on, for example, a height differential that is needed to provide a different or desired response function. In some embodiments, for example, a height of the dielectric material under the electrodes 602b can range from 100 nm to 10 μm. In some embodiments, a dielectric pedestal can be formed by etching back the substrate 604b to create the dielectric pedestals, instead of additively creating the dielectric pedestals. In some embodiments, in addition to providing the dielectric material 605b under each of the electrodes 602b, the dielectric material 605b can also be provided between each of the electrodes 602b (as filler). Alternatively or additionally, the dielectric material 605a can be the same as or different from dielectric material 605b. For example, in some embodiments, the dielectric material 605a can be 02, N, etc. and the dielectric material 605b can be $SF_6$, glass, porcelain, etc.

Figure 7:
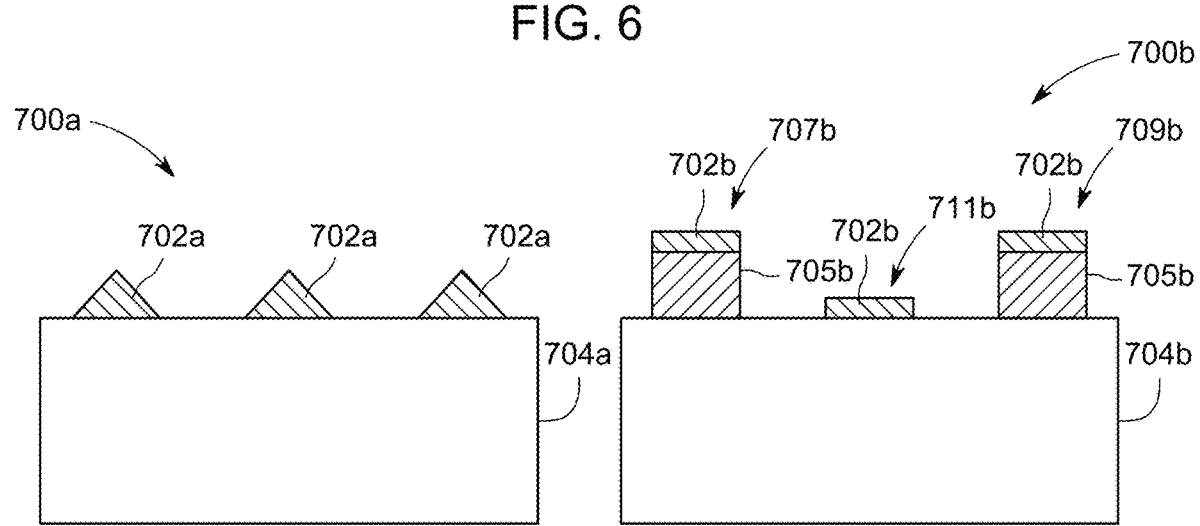
FIG. 7 is a diagram of a sensor assembly having an electrode configuration in accordance with at least some embodiments of the present disclosure.

FIG. 7 illustrates a sensor assembly 700a including electrodes 702a and a sensor assembly 700b including electrodes 702b. The sensor assembly 700a and the sensor assembly 700b include a respective first substrate 704a and second substrate 704b. To achieve different response functions, the electrodes 702a can have a symmetric configuration (e.g., all the electrodes 702a will have the same configuration) and the electrodes 702b can have an asymmetric configuration (e.g., the electrodes 702a will have different configurations), or vice versa. For example, the electrodes 702a can have one or more of the geometric configurations described above, e.g., a pyramidal configuration. Conversely, some of the electrodes 702b can have, for example, a dielectric material 705b disposed thereunder, while some of the electrodes 702b do not. For example, a first array 707b and a third array 709b of electrodes 702b can have the dielectric material 705b disposed thereunder, and a second array 711b can be provided without the dielectric material 705b. As can be appreciated, other configurations of the electrodes 702b can also be used to obtain the asymmetric design. For example, the first array 707b and the second array 711b can have the dielectric material 705b and the third array 709b can be provided without the dielectric material 705b, or the third array 709b and the second array 711b can have the dielectric material 705b and the first array 707b can be provided without the dielectric material 705b.

Figure 8:
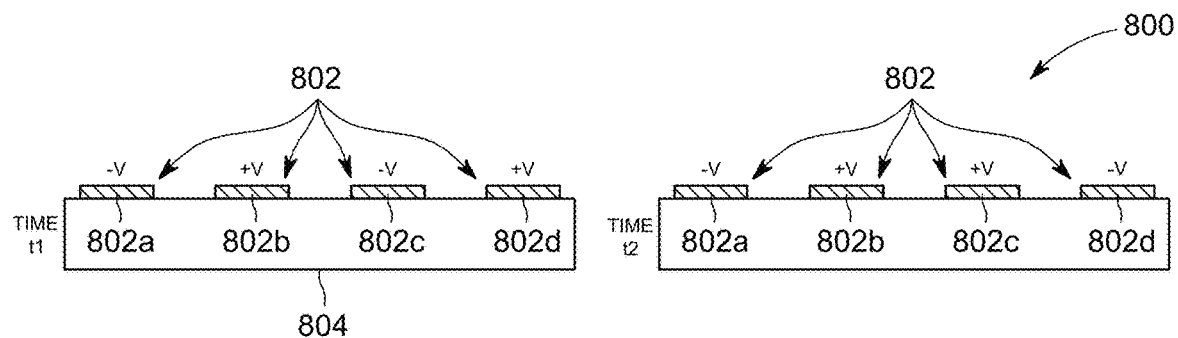
FIG. 8 is a diagram of a sensor assembly having an electrode configuration in accordance with at least some embodiments of the present disclosure.
Figure 9:
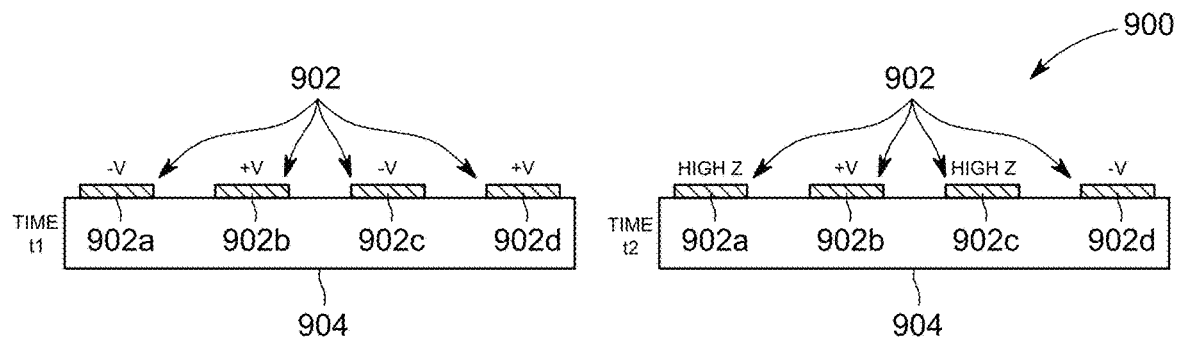
FIG. 9 is a diagram of a sensor assembly having an electrode configuration in accordance with at least some embodiments of the present disclosure.
Figure 10:
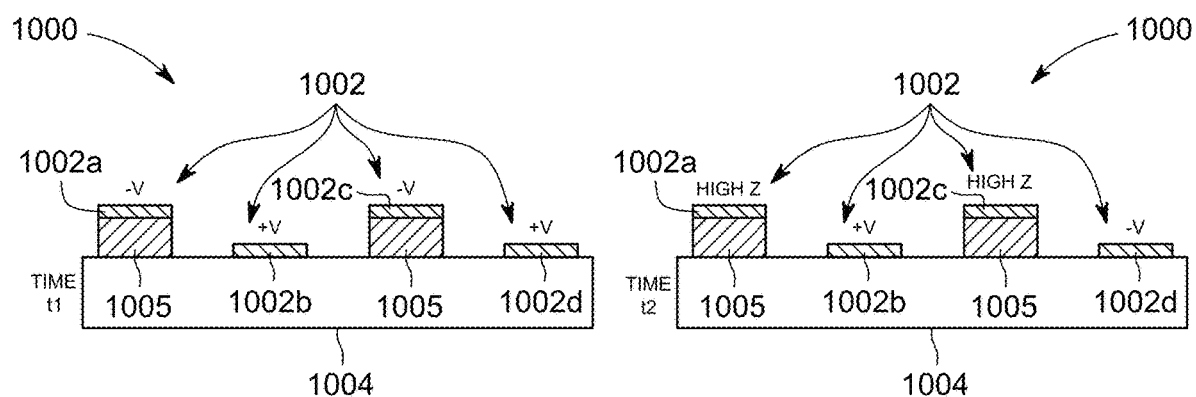
FIG. 10 is a diagram of a sensor assembly having an electrode configuration in accordance with at least some embodiments of the present disclosure.

Thus far, each of the embodiments described herein have included two different sensor assemblies to achieve a desired or different response functions. The present disclosure, however, is not so limited. For example, in some embodiments, one sensor assembly can be used to achieve different response functions. More particularly, FIGS. 8-10 illustrate sensor assemblies 800-1000, respectively, that can be used to achieve different response functions. For example, each of the sensor assemblies 800-1000 can include a first electrode configuration including a plurality of electrodes having a first biasing configuration and a second electrode configuration including a plurality of electrodes having a second biasing configuration that is different from the first biasing configuration. More particularly, the first electrode configuration and the second electrode configuration can be configured for time multiplexing and can respectively provide a first input corresponding to a first time and a first response function, and a second input corresponding to a second time and a second response function that is different from the first response function.

FIG. 8, for example, illustrates the sensor assembly 800 including an electrode configuration including a plurality of electrodes 802 (electrodes 802). The electrodes 802 can be any of the previously described electrodes. For example, the electrodes 802a can be rectangular, circular, oval, elliptical, triangular, pyramidal, etc., and/or can have dielectric material disposed thereunder (dielectric pedestal) or therebetween (dielectric filler). For illustrative purposes, the electrodes 802 are shown including four electrodes 802a-802d having a generally rectangular configuration defined by relatively flat surfaces. The electrodes 802a-802d can be provided on a substrate 804 (as in FIG. 8, which is identical to the previously described substrates) and can be positioned within the inner volume 114 of the processing chamber 104. Alternatively or additionally, the electrodes 802a-802d can be simply positioned within the inner volume 114 of the processing chamber 104 without being provided on the substrate 804.

Continuing with reference to FIG. 8, during (or at) a first time $t_1$, the electrodes 802 can be biased to one or more voltage potential biasing schemes (e.g., a first electrode configuration). For example, during time $t_1$ the electrode 802a can have a negative voltage potential, the electrode 802b can have a positive voltage potential, the electrode 802c can have a negative voltage potential, and the electrode 802d can have a positive voltage potential. Other voltage potential biasing schemes can also be used. The voltage potentials biasing schemes present at the electrodes 802a-802d can be controlled by a controller, e.g., the controller 128.

During a time $t_2$, the controller can change the voltage potential biasing schemes at the electrodes 802a-802d to achieve different response functions. For example, during the time $t_2$, the controller can change one or more of the voltage potentials present at the electrodes 802a-802d (e.g., a second electrode configuration). For example, during time $t_2$, the controller can change the voltage potential at the electrode 802c from negative to positive and can change the voltage potential at the electrode 802d from positive to negative. Alternatively or additionally, the controller can change the voltage potential at the electrode 802a from negative to positive and can change the voltage potential at the electrode 802b from positive to negative. The controller can change the voltage biasing schemes at the electrodes 802a-802d by, for example, adjusting one or more electrical parameters, including, but not limited to, current, power, resistance, capacitance, inductance, impedance, etc., at the electrodes 802a-802d. For example, in some embodiments, at time $t_2$ the controller can adjust a phase of a current through the electrode 802c from negative to positive and can adjust a phase of the current through the electrode 802d from positive to negative to change the voltage at the electrodes 802c and 802d, respectively.

FIG. 9 illustrates the sensor assembly 900 including an electrode configuration including electrodes 902 disposed on a substrate 904. The sensor assembly 900 is substantially identical to the sensor assembly 800. Accordingly, only those features that are unique to the sensor assembly 900 are described herein. Particularly, in addition to changing a voltage potential biasing scheme present at the electrodes 902, the controller can be configured to change one or more of the other electrical parameters, e.g., resistance and impedance, present at the electrodes 902. For example, at time $t_1$ (e.g., the electrodes 902a-902d are in a first electrode configuration), the electrode 902a can have a negative voltage potential and a relatively low impedance (or a relatively high impedance), the electrode 902b can have a positive voltage potential and a relatively high or low impedance, the electrode 902c can have a negative voltage potential and a relatively low impedance (or a relatively high impedance), and the electrode 902d can have a positive voltage potential and a relatively high or low impedance. Other impedance and/or voltage biasing schemes can also be used.

During time $t_2$ (e.g., the electrodes 902a-902d are in a second electrode configuration), the controller can change the impedance and/or voltage potential biasing schemes at the electrodes 902a-902d to achieve different response functions. For example, during time $t_2$, the controller can change the impedance at the electrode 902a from relatively low to relatively high and can change the impedance at the electrode 902c from relatively low to relatively high. Additionally, at $t_2$ the controller can change a voltage potential at one or more of the electrodes 902. For example, at $t_2$ the voltage potential present at the electrode 902d can be changed from positive to negative, and/or the voltage potential present at the electrode 902b can be changed from positive to negative. For example, in some embodiments, at time $t_2$ the controller can adjust a phase of a current through the electrode 902d from positive to negative to change the voltage at the electrode 902d from positive to negative, and can adjust the impedance (e.g., increase the impedance) of the electrodes 902a and 902c by increasing the current through, for example, respective inductors (not shown) disposed on the electrodes 902a and 902c.

FIG. 10 illustrates the sensor assembly 1000 including an electrode configuration including electrodes 902 disposed on a substrate 1004. The sensor assembly 900 is substantially identical to the sensor assemblies 800, 900. Accordingly, only those features that are unique to the sensor assembly 1000 are described herein. Particularly, as described above, dielectric material 1005 can be provided under one or more of the electrodes 1002a-1002d. Alternatively or additionally, a dielectric material (not explicitly shown in FIG. 10) can also be provided between the 1002a-1002d. The dielectric material 1005 can be configured to facilitate changing the impedance of the electrodes 1002a-1002d when the controller changes the impedance (or voltage) biasing schemes from $t_1$ to $t_2$, or vice versa, e.g., the dielectric material can be used to create more separation between the response functions of the electrodes 1002a-1002d when the electrodes 1002a-1002d are biased in different configurations.

Figure 11:
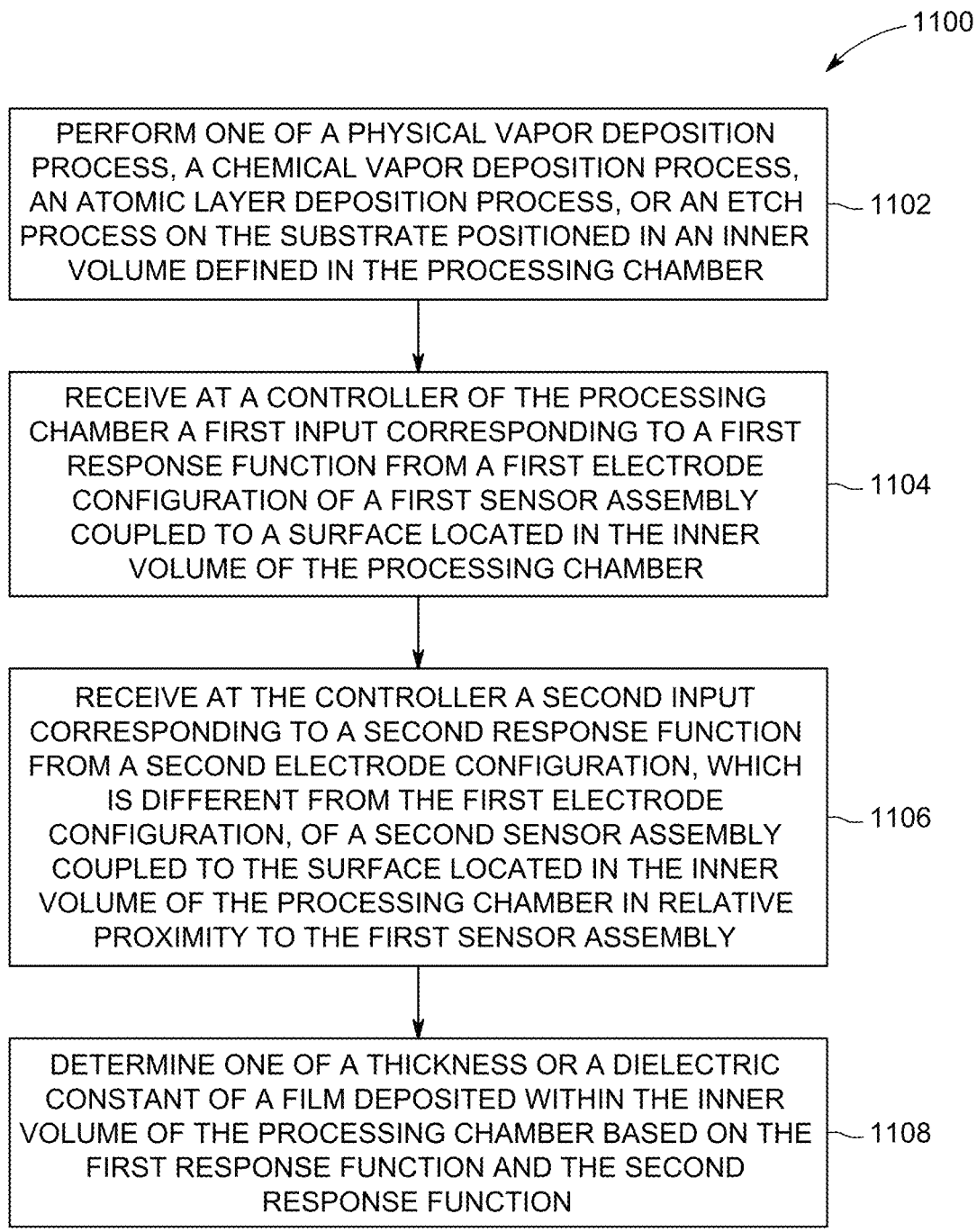
FIG. 11 is a flowchart of a method of processing a substrate in a processing chamber, in accordance with embodiments of the present disclosure.

FIG. 11 is a flowchart of a method 1100 of processing a substrate in a processing chamber, in accordance with an embodiment of the present disclosure.

At 1102, a substrate, e.g., the substrate 102, can be positioned in an inner volume defined in one or more of the previously described processing chambers, e.g., the inner volume 114 of the processing chamber 104. For example, the processing chamber can be a PVD processing chamber configured to deposit a film on a substrate, e.g., the substrate 102.

In some embodiments, e.g., when a pair of sensor assemblies are used in the processing chamber (FIGS. 2-7), when the substrate is being processed, some of the material that is sputtered from a target (e.g., the target 116) for forming a film on the substrate will also be deposited on a first electrode configuration of a first sensor assembly and on a second electrode assembly of a second sensor assembly, which, as noted above, is located in the inner volume of the processing chamber in relative proximity to the first sensor assembly. Alternatively or additionally, when the sensor assembly is a single sensor assembly (FIGS. 8-10), some of the material that is sputtered from the target for forming the film on the substrate will also be deposited on a first electrode configuration of a sensor assembly during a first biasing scheme and during a second biasing scheme.

Next, at 1104, the controller of the processing chamber receives a first input corresponding to a first response function from a first electrode configuration of a first sensor assembly. For example, the first input can correspond to a first response function from one of the first electrode configurations of FIGS. 2-7 or can correspond to a first response function from one of the first electrode configurations of FIGS. 8-10, e.g., at a time $t_1$.

Similarly, at 1106, the controller also receives a second input corresponding to a second response function from the second electrode configuration, which is different from the first electrode configuration. For example, the second input can correspond to a second response function from one of the second electrode configurations of FIGS. 2-7 or can correspond to a second response function from one of the second electrode configurations of FIGS. 8-10, e.g., at a time $t_2$. Accordingly, as discussed above, the response function received from the second electrode configuration is going to be different from the first response function received from the first electrode configuration.

Next, at 1108, the controller determines, based on the first response function and the second response function, a thickness (t) and/or a dielectric constant (k) of the film deposited within the inner volume, e.g., on the substrate, of the processing chamber as a result of the process. More particularly, one or more look-up tables can include empirical data of simulations that have been performed during a design process of the various sensor assembly configurations and/or the processing chamber. The simulations are configured to sweep all expected film combinations of film thickness (t) and dielectric constants (k) which may be deposited on one or more of the sensor assembly configurations described herein. The results of these simulations are tabulated in the look-up tables and stored in the controller, e.g., the memory 132, as the response functions for the different sensor assembly configurations.

The controller uses the response functions as the substrate is being processed for measuring (isolating, via good confidence/resolution of a common value or an intersection point) a specific value that satisfies measurements acquired by each of the different sensor assembly configurations. For example, the controller receives a first capacitance measurement from the first electrode configuration (e.g., electrodes 202a) of the first sensor assembly (e.g., sensor assembly 200a) based on an amount of film deposited thereon. The controller also receives a second capacitance measurement from the second electrode configuration (e.g., electrodes 202b) of the second sensor assembly (e.g., sensor assembly 200b) based on an amount of film deposited thereon. The controller than determines a thickness of the material (t) and a dielectric constant (k) by finding an intersection point all of the possible (t, k) values that are tabulated in the look-up tables stored in the memory 132 and that correspond to the measured capacitances obtained from the first sensor assembly and the second sensor assembly.

Similarly, the controller receives a first capacitance measurement at a time $t_1$ from the first electrode configuration (e.g., electrodes 802a-802d during a first biasing scheme) of the sensor assembly (e.g., sensor assembly 800) based on an amount of film deposited thereon. The controller also receives a second capacitance measurement at a time $t_2$ from the second electrode configuration (e.g., electrodes 802a-802d during a second biasing scheme) based on an amount of film deposited thereon. The controller than determines a thickness of the material (t) and a dielectric constant (k) by finding an intersection point all of the possible (t, k) values that are tabulated in the look-up tables stored in the memory 132 and that correspond to the measured capacitances obtained during times $t_1$ and $t_2$ from the first sensor assembly.

While the foregoing is directed to embodiments of the present disclosure, other and further embodiments of the disclosure may be devised without departing from the basic scope thereof.

The invention claimed is:

1. A processing chamber, comprising:
an inner volume defined in the processing chamber; and
a sensor assembly coupled to a surface located in the inner volume of the processing chamber and comprising an electrode configuration comprising a plurality of electrodes configured for time multiplexing, such that the plurality of electrodes provides a first input corresponding to a first time and a first response function, and a second input corresponding to a second time and a second response function different from the first response function.

2. The processing chamber according to claim 1, further comprising a controller that receives the first input corresponding to the first time and the first response function and the second input corresponding to the second time and the second response function from the plurality of electrodes and determines one of a thickness or a dielectric constant of a film deposited within the inner volume of the processing chamber based on the first response function and the second response function, wherein the controller determines the thickness and the dielectric constant of the film deposited within the inner volume of the processing chamber.

3. The processing chamber according to claim 2, wherein the electrode configuration is configured to measure a capacitance, and wherein the first input and the second input are measurements of capacitance.

4. The processing chamber according to claim 1, wherein the plurality of electrodes has a first biasing configuration at the first time and a second biasing configuration, which is different from the first biasing configuration, at the second time.

5. The processing chamber according to claim 1, wherein the sensor assembly comprises a substrate on which the electrode configuration is disposed, and wherein at least one of the plurality of electrodes of the electrode configuration is disposed on a corresponding dielectric pedestal.

6. The processing chamber according to claim 1, wherein at the second time a phase of a current through a first electrode of the plurality of electrodes is adjusted from negative to positive and a phase of a current through a second electrode of the plurality of electrodes is adjusted from positive to negative to change at least one of a voltage or an impedance at the first electrode and the second electrode, respectively.

7. The processing chamber according to claim 1, wherein a dielectric filler is disposed between each electrode of the plurality of electrodes of the electrode configuration.

* * * * *